United States Patent [19]
Calligaro
[11] 4,329,774
[45] May 18, 1982

[54] SILICON RESISTOR HAVING A VERY LOW TEMPERATURE COEFFICIENT

[75] Inventor: Michel Calligaro, Paris, France
[73] Assignee: Thomson-CSF, Paris, France

[21] Appl. No.: 54,605
[22] Filed: Jul. 3, 1979
[30] Foreign Application Priority Data
Jul. 4, 1978 [FR] France ................ 78 19932
[51] Int. Cl.[3] ................ H01L 21/22
[52] U.S. Cl. ................ 29/583; 29/569 R; 29/576 R; 148/188; 148/190; 338/7; 357/63; 357/64; 357/89
[58] Field of Search ................ 148/188, 190; 29/569 R, 29/576 R, 583; 357/63, 64, 89; 338/7

[56] References Cited

U.S. PATENT DOCUMENTS

| | | | |
|---|---|---|---|
| 3,248,677 | 4/1966 | Hunter et al. | 357/64 X |
| 3,337,793 | 8/1967 | Gibbons | 323/66 |
| 3,473,976 | 10/1969 | Castrucci et al. | 357/63 X |
| 3,484,658 | 12/1969 | Komatsu | 357/64 X |
| 3,683,306 | 8/1972 | Bulthuis et al. | 338/7 |
| 3,711,325 | 1/1973 | Hentzschel | 148/188 X |
| 3,963,523 | 6/1976 | Tanaka et al. | 148/188 X |

FOREIGN PATENT DOCUMENTS

| | | |
|---|---|---|
| 1569674 | 1/1968 | France . |
| 792274 | 3/1958 | United Kingdom . |
| 1209543 | 10/1970 | United Kingdom . |
| 1249317 | 10/1971 | United Kingdom . |
| 1474924 | 5/1977 | United Kingdom . |

*Primary Examiner*—G. Ozaki
*Attorney, Agent, or Firm*—Oblon, Fisher, Spivak, McClelland & Maier

[57] ABSTRACT

An ohmic resistor of the bulk resistance type having a large mass of semiconductor material and remarkably stable resistivity at the operating temperature is made up of a rectangular parallelepiped of silicon doped by at least two substances, one substance being of the acceptor type and the other being of the donor type. The resistor then has much higher stability within the temperature range of −50° C. to +200° C. A second substance of the donor type (consisting of caesium, for example, while the first consists of gold) permits a further improvement in stability.

2 Claims, 7 Drawing Figures

SILICON RESISTOR HAVING A VERY LOW TEMPERATURE COEFFICIENT

BACKGROUND OF THE INVENTION

The present invention relates to ohmic resistors of the bulk resistance type having a large mass of semiconductor material. The method of fabrication of resistors of this type and especially silicon resistors forms part of the invention.

It is a current practice to produce rods of silicon doped right through by a p-type impurity and having an ohmic resistance which exhibits considerable variation with temperature. Thus the resistivity of material of this type is multiplied by about three within the temperature range of 20° C. to 200° C. It is in fact known that the resistivity of silicon is inversely proportional to the number of conduction holes, or in other words of free acceptor atoms, and to their mobility, in accordance with the formula:

$$\rho = \frac{1}{q\,\mu_p\,N_p} \qquad (1)$$

where:

q represents the charge of the electron, $\mu_p$ is the mobility of the holes, $N_p$ is the number of conduction holes.

Within a range of −50° C. to +200° C., it can be considered that the number of conduction holes is substantially constant but that, on the other hand, their mobility varies in accordance with the formula:

$$\mu_p = \alpha T^{-2.2} \qquad (2)$$

where

T is the absolute temperature in degrees Kelvin and $\alpha$ is a suitable coefficient.

It is deduced from formulae (1) and (2) that, within the temperature range indicated, the resistivity is approximately proportional to the power 2.2 of the absolute temperature.

SUMMARY OF THE INVENTION

The aim of the invention is to limit the temperature dependence of the resistivity of a semiconductor material and to permit the fabrication of resistors having substantially constant values over a temperature range which, from an industrial standpoint, lies in a practical field of utilization.

The resistor in accordance with the invention is constituted by a semiconductor body doped right through by a first substance which is capable of producing energy levels of the acceptor type at the edge of the forbidden band on the low-energy side and by a second substance which is capable of producing energy levels of the donor type, said donor levels being located in the lower portion of the forbidden band but closer to the center of said band than the energy level of the first impurity.

BRIEF DESCRIPTION OF THE DRAWINGS

A more complete understanding of the invention will be gained from the following description in which further distinctive features will appear, reference being made to the accompanying drawings in which.

DESCRIPTION OF THE PREFERRED EMBODIMENTS

Figure 1:
FIGS. 1 to 6 show the steps involved in the fabrication of a resistor according to the invention.

It will be postulated by way of example that it is desired to fabricate a resistor in the form of a parallelepipedal rod of semiconducting silicon having two metallized square faces (designated by the reference numerals 61 and 62 in FIG. 6) which serve as ohmic contacts. In the case of a value of resistance within the range of about ten to a few tens of ohms, the metallized faces have a side l of the order of 1 to 3 mm, for example, and a thickness h of the order of 250 to 1000 microns.

In the method of fabrication according to the invention, the initial substrate employed by way of example will consist of boron-doped silicon. One advantage of p-doped semiconducting material of this type lies in the fact that, although the resistivity is not strictly constant when the terminal voltage is caused to vary, it varies in accordance with a substantially linear law up to high values of the electric field ($10^4$ V/cm).

FIG. 1 is a transverse sectional view of a boron-doped silicon wafer 1 having a resistivity of 5 ohm-cm, for example. The wafer thickness is 750 microns. Its lateral dimensions are of the order of 15 to 30 mm, thus permitting collective manufacture of at least one hundred resistors in accordance with the invention.

Although boron is the most common p-type impurity in the case of silicon, the method of fabrication of resistors in accordance with the invention makes it possible to start from silicon which is doped by a p-type impurity other than boron (aluminum, gallium).

Figure 2:
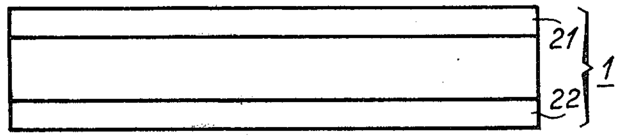

A first step of the method consists in carrying out complementary diffusion of p-type substance such as boron, for example, this diffusion being limited to two surface layers on each side of the wafer. The large faces of this latter are covered with a boron deposit which is as uniform as possible, the wafer being then introduced into a furnace which is mantained at a temperature within the range of 1100° C. to 1250° C. There are thus obtained in about two hours the layers 21 and 22 shown in FIG. 2 and consisting of films of p+ doped silicon (of the order of $10^{20}$ acceptor substance atoms per $cm^3$) having a thickness of a few microns which is sufficient to avoid the presence of parasitic resistances at the input and output of the resistive rod.

Figure 3:
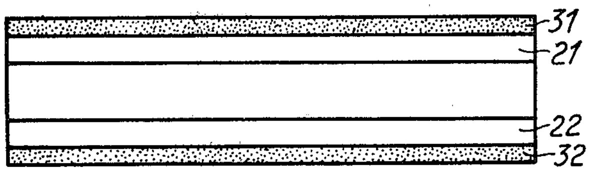

In a second step, the silicon wafer is doped right through by means of uniform gold deposits 31 and 32 (FIG. 3) placed on the large faces of the wafer. This is achieved by means of a thermal treatment which is similar to that of the previous step although at a lower temperature (800° C. to 1000° C.), the treatment time being extended to over two hours. Through-doping with $10^{14}$ to $10^{15}$ atoms of gold per $cm^3$ is thus obtained. After this treatment, the wafer is subjected to chemical attack in the conventional manner in order to remove the excess gold and gold alloy which has formed.

Figure 4:
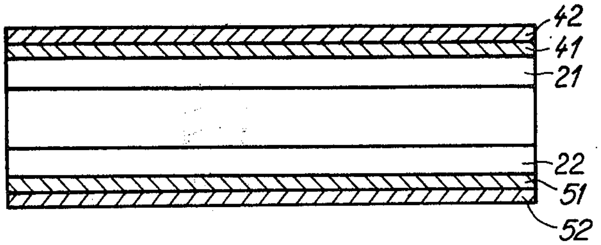

In a third step, metallizing of the large faces is carried out by depositing in the conventional manner a layer 41 of nickel, then a layer 42 of gold on the face located on the same side as the layer 21. Although not shown in FIG. 4, the same procedure is adopted in the case of the large face located on the opposite side.

Figure 5:
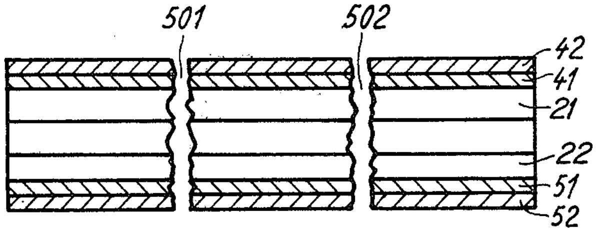
Figure 6:
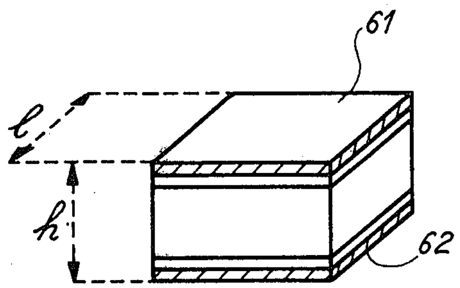

In a fourth step, the metallized wafer is cut on both faces (layers 41, 42, 51, 52) along the lines of an orthogonal lattice, this operation being performed either by means of a diamond saw or by means of any other conventional cutting process. The end result is the formation of a plurality of rectangular parallelepipeds. FIG. 5 thus shows two sawcuts 501, 502. One of the rectangular parallelepipeds is illustrated in FIG. 6, in which the metallic films are shown as simple layers 61 and 62 for the sake of enhanced simplicity. The ohmic resistance has been measured at different temperatures in a first sample consisting of silicon doped only by boron, then in a second sample doped both by boron and gold in accordance with the method hereinabove described. The two samples fabricated from boron-doped silicon having a resistivity of 5 ohm-cm had the following dimensions:

$l=1.4$ mm $h=0.75$ mm

Figure 7:
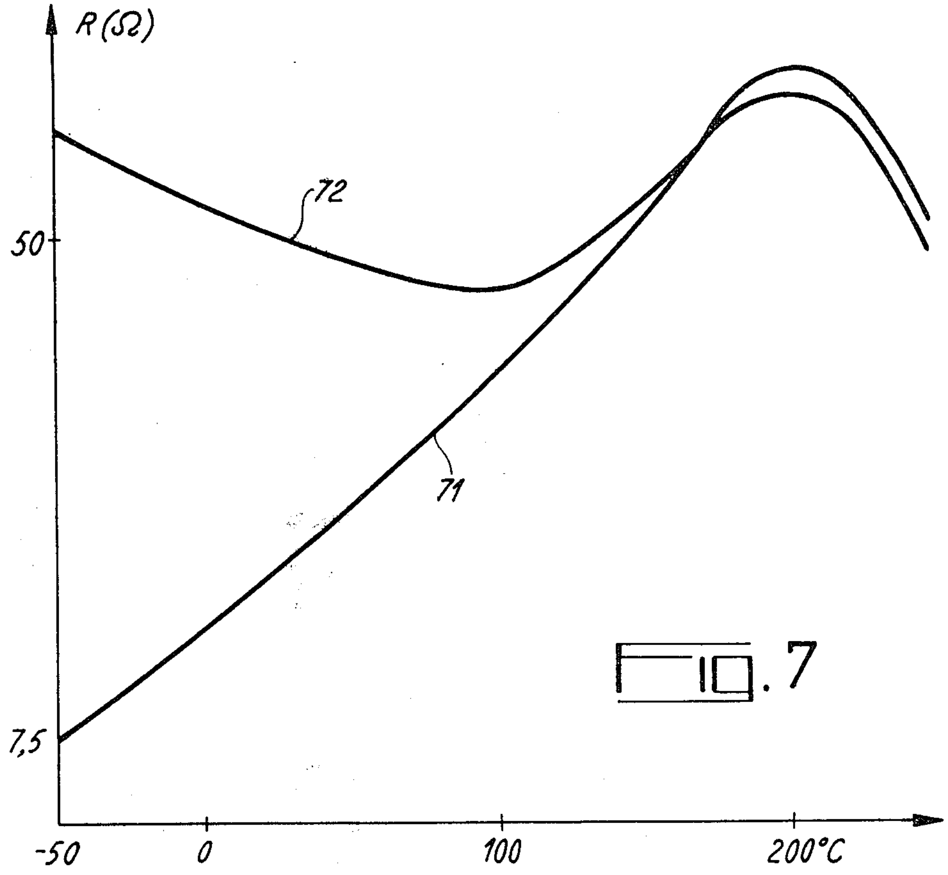
FIG. 7 shows compared curves of resistivity of a resistor of known type and of a resistor in accordance with the invention.

In FIG. 7, temperatures within the range of $-50°$ C. to $+250°$ C. approximately have been plotted as abscissae whilst the resistances in ohms have been plotted as ordinates. Curve 71 gives the results in the case of the first sample; it is apparent that the resistance varies between 7.5 and 63 ohms within the temperature range of $-50°$ C. to $+200°$ C. In regard to the second sample, curve 72 deviates from the value of 50 ohms (value of 15° C.) only by approximately 20% within the same temperature range.

Resistors of this type can be employed in the fabrication of miniaturized ohmic loads in units which deliver "peak" power outputs of the order of 1 to a number of kilowatts with pulses of the order of several hundred volts. This accordingly makes it possible to avoid the undesirable discharges which would otherwise have arisen from the use of carbon resistors.

One possible explanation of the phenomenon of compensation for the variation in resistance with temperature could be as follows:

Whereas a doping substance of the acceptor type such as boron produces energy levels which are usually distributed at the edge of a forbidden band on the low-energy side, a doping substance such as gold, platinum, molybdenum, tungsten or iron produces energy levels which are closer to the Fermi level. It is worthy of note that gold is amphoteric and produces on the one hand a donor level at $+0.35$ eV of the valence band and on the other hand an acceptor level at 0.54 eV of the conduction band. However, only the donor levels appear to play a part in the compensation for the temperature effect.

Below a certain temperature threshold, the donor level traps part of the conduction holes.

A temperature rise to a value which nevertheless remains below said threshold value produces an increase in the number of conduction holes as a result of the normal action of a rise in the Fermi level and compensates for the effect produced by the reduction in mobility of said holes.

It is apparent from FIG. 7 that the compensation is very strong on the one hand below 100° C. and very weak above this temperature.

The compensation can be improved within a given temperature range by having recourse to a third doping with an impurity having a donor level which is different from that of the second impurity or dopant (gold in the example mentioned earlier). By way of example, caesium or manganese having a donor level in the vicinity of $+0.5$ eV would make it possible to improve the curve in the vicinity of 100° C.

Furthermore, in the method described in the foregoing, gold can be replaced by platinum, molybdenum, tungsten or iron.

What is claimed as new is:

1. A method of fabrication of a silicon resistor having a very low temperature coefficient and constituted by a semiconductor body doped right through by a first substance which is capable of producing energy levels of the acceptor type at the edge of the forbidden band on the low-energy side and by a second substance which is capable of producing energy levels of the donor type, said donor levels being located in the lower portion of the forbidden band but closer to the center of said band than the energy level of the first substance wherein said method comprises at least the following steps:

(a) starting from a p-type semiconductor body of parallelepipedal shape, atoms of the first substance are diffused from deposits placed on two opposite faces of said body;

(b) the semiconductor body is doped right through from deposits of the second substance on the same faces;

(c) the two faces are metallized in order to form ohmic contacts constituted by successive deposits on each face of a layer of nickel and a layer of gold; and (d) the semiconductor body is cut along the lines of an orthogonal lattice which has been marked out on one of the metallized faces.

2. A method according to claim 1, wherein:

in step (a), there is initially employed a wafer of p-doped silicon covered with boron deposits on the large faces thereof and said wafer is maintained for two hours at a temperature within the range of 1100° C. to 1250° C.;

in step (b), the wafer which has been covered with gold deposits on the large faces thereof is subjected to a prolonged heat treatment for over two hours at a temperature within the range of 800° C. to 1000° C.; and in step (c), metallizing is carried out by employing nickel and then gold in succession.

* * * * *